(12) United States Patent
Leenders et al.

(10) Patent No.: US 7,903,232 B2
(45) Date of Patent: Mar. 8, 2011

(54) LITHOGRAPHIC APPARATUS AND DEVICE MANUFACTURING METHOD

(75) Inventors: Martinus Hendrikus Antonius Leenders, Rotterdam (NL); Michel Riepen, Bergschenhoek (NL); Martin Anton Bos, Wageningen (NL)

(73) Assignee: ASML Netherlands B.V., Veldhoven (NL)

( * ) Notice: Subject to any disclaimer, the term of this patent is extended or adjusted under 35 U.S.C. 154(b) by 755 days.

(21) Appl. No.: 11/402,258

(22) Filed: Apr. 12, 2006

(65) Prior Publication Data
US 2007/0243697 A1    Oct. 18, 2007

(51) Int. Cl.
*G03B 27/52* (2006.01)
*G03B 27/42* (2006.01)
(52) U.S. Cl. .............................. 355/30; 355/53
(58) Field of Classification Search .......... 355/30, 355/53, 67; 250/548
See application file for complete search history.

(56) References Cited

U.S. PATENT DOCUMENTS

| | | | |
|---|---|---|---|
| 4,509,852 A | 4/1985 | Tabarelli et al. | |
| 6,329,122 B2 * | 12/2001 | Hotta et al. | 430/278.1 |
| 6,952,253 B2 | 10/2005 | Lof et al. | |
| 2005/0036183 A1* | 2/2005 | Yeo et al. | 359/15 |
| 2006/0038968 A1 | 2/2006 | Kemper et al. | |
| 2007/0004182 A1* | 1/2007 | Chang et al. | 438/478 |

FOREIGN PATENT DOCUMENTS

| | | |
|---|---|---|
| EP | 1482372 | * 12/2004 |
| KR | 10-2004-0103401 | 12/2004 |
| WO | 99/49504 | 9/1999 |
| WO | WO99/49504 | * 9/1999 |

OTHER PUBLICATIONS

English translation of Official Action issued Mar. 20, 2008 in corresponding Korean Application No. 10-2007-0035909.

* cited by examiner

*Primary Examiner* — Hung Henry Nguyen
(74) *Attorney, Agent, or Firm* — Pillsbury Winthrop Shaw Pittman LLP (57) ABSTRACT

An immersion lithographic exposure apparatus in which the pH of the top coat of the immersion liquid is chosen so as to maximize the relative speed at which a part of the liquid supply system and the substrate W can be moved relative to each other without collapse of a meniscus extending between those components.

31 Claims, 4 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. This is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
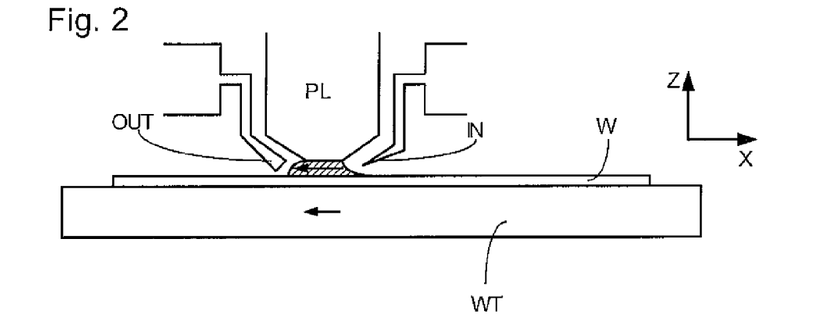
FIGS. 2 and 3 depict a liquid supply system used in a prior art lithographic projection apparatus.
Figure 3:
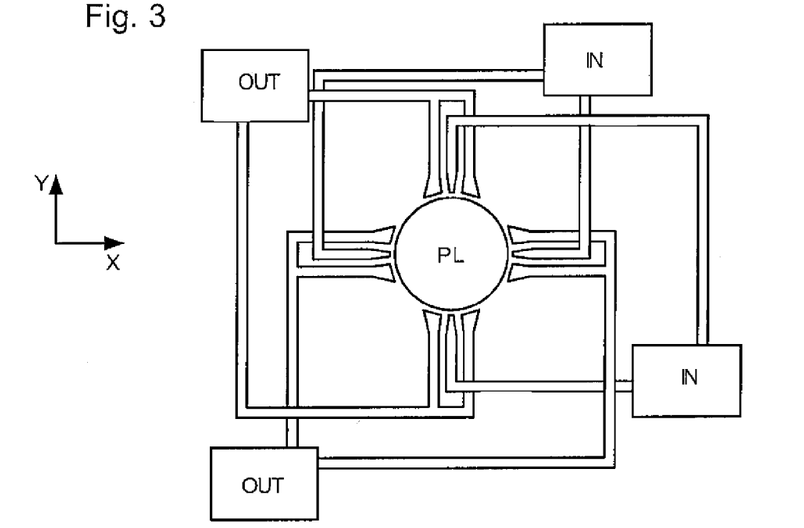

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of inlets and outlets positioned around the final element are possible, one example is illustrated in FIG. 3 in which four sets of an inlet with an outlet on either side are provided in a regular pattern around the final element.

Figure 4:
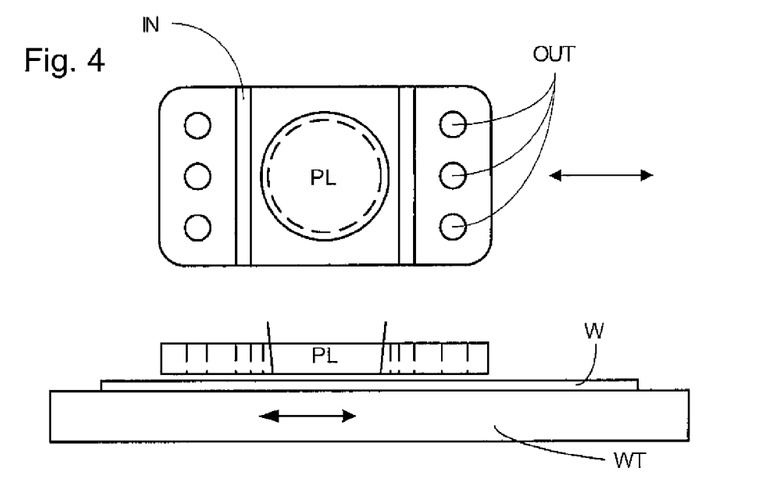
FIG. 4 depicts a liquid supply system according to another prior art lithographic projection apparatus.
Figure 5:
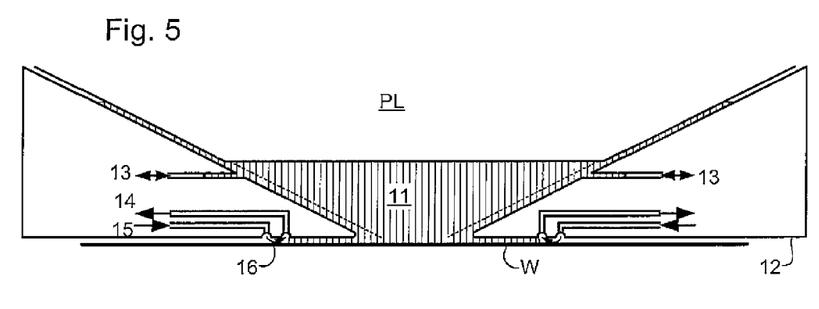
FIG. 5 depicts a liquid supply system which may be used in the present invention.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal. Such as system with a gas seal is illustrated in FIG. 5 and disclosed in U.S. Pat. No. 6,952,253.

In U.S. Pat. No. 6,952,253 the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

Although the achievable resolution is increased with an immersion lithography exposure apparatus in which the imaging beam of radiation is passed through an immersion liquid, the through put of such an apparatus can be reduced relative to a conventional apparatus due to immersion liquid handling considerations.

SUMMARY OF THE INVENTION

It is desirable to provide an apparatus with increased through put and/or more robust liquid handling.

According to an aspect of the invention, there is provided a lithographic apparatus including an immersion lithography exposure apparatus for exposing a substrate to a beam of radiation through immersion liquid, wherein a pH of the immersion liquid is within 2 of the pH of the immersion liquid at which its zeta potential when on the surface of the substrate is zero.

According to an aspect of the invention, there is provided a device manufacturing method including projecting a patterned beam of radiation through immersion liquid onto a substrate, wherein the immersion liquid is in contact with a surface of the substrate and wherein a pH of the immersion liquid is within 2 of the pH of the immersion liquid at which its zeta potential when on the surface of the substrate is zero.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
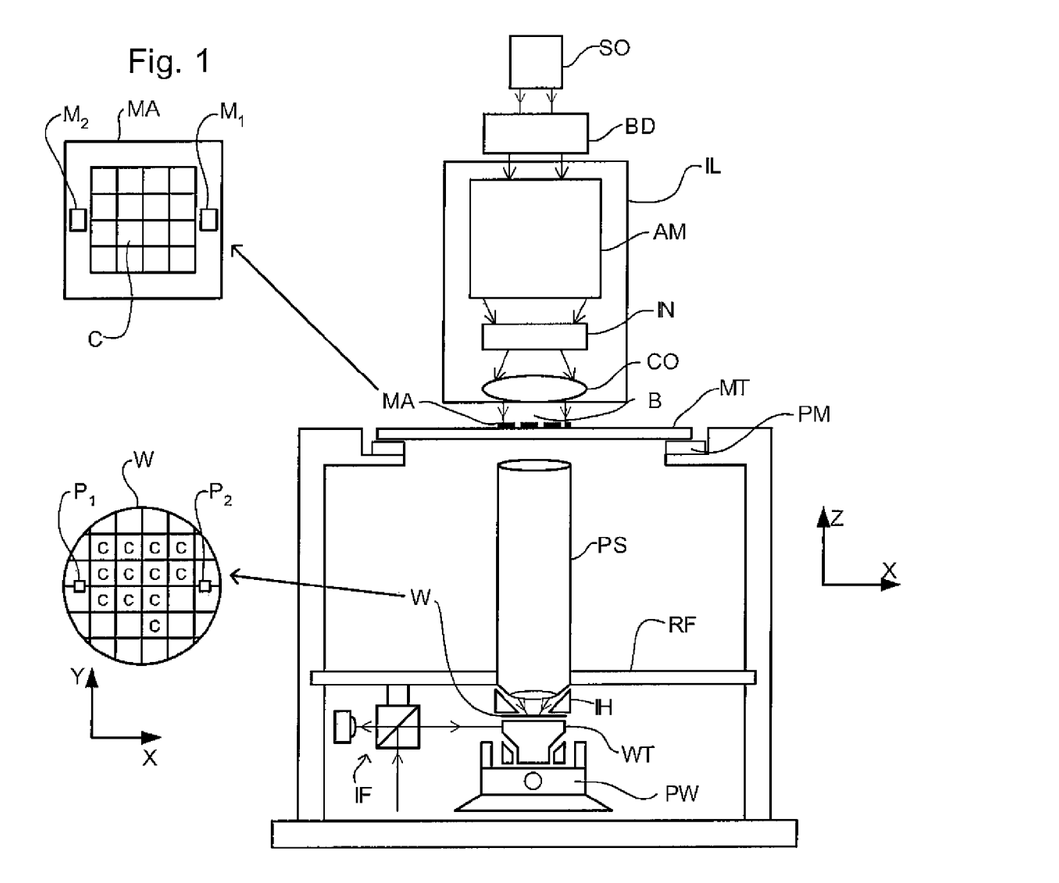
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or DUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as R-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIGS. 2-4 illustrate localized area liquid supply systems in which liquid is supplied between a final element of the projection system PS and the substrate W on only a localized area of the substrate W which is much smaller, in plan, than the total top surface of the substrate W. The substrate W is then moved under the projection system PS so that the localized area which is covered in immersion liquid changes.

All of these localized area liquid supply systems need to provide containment for the liquid. Preferably a contactless containment for the liquid is provided such that there is no physical contact between physical parts of the liquid supply system and the substrate W. This is often provided by a flow of gas and such a system is illustrated in FIG. 5 in which a flow of gas 16 from an inlet 15 to an outlet 14 in a bottom surface of a barrier, or seal, member 12 of a liquid supply system is effective to create a seal between the bottom of the barrier member 12 and the substrate W.

Figure 6:
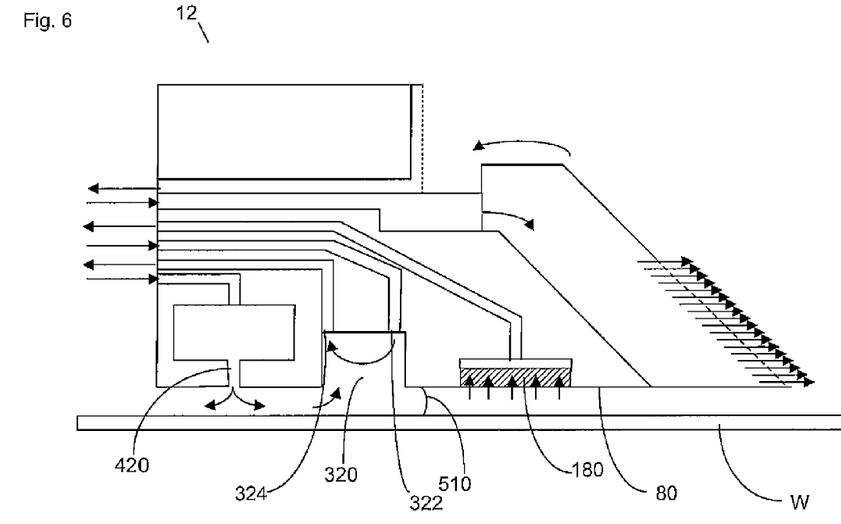
FIG. 6 depicts a liquid supply system which may be used in the present invention.

A further liquid supply system is illustrated in FIG. 6. Operation of the various inlets and parts of the barrier member 12 above the bottom surface 80 should be readily appreciated by one of ordinary skill in the art. The following disclosure relates to how the liquid is contained in the space 11, and in particular, how the liquid behaves between the bottom surface 80 of the seal member 12 and the top surface of the substrate W.

Working radially outwardly from the optical axis of the projection system, there is provided a liquid removal device 180 such as the one disclosed in U.S. application Ser. No. 10/921,348, filed Aug. 19, 2004. Radially outwardly of the liquid removal device 180 is provided a recess 320 which is connected through inlet 322 to the atmosphere and via outlet 324 to a low pressure source. Radially outwardly of recess 320 is a gas knife 420. The arrangement of these items on the bottom surface 80 of the seal member 12 is described in detail in U.S. Application 60/643,626, filed Jan. 14, 2005. A liquid meniscus 510 is formed between the substrate W and the bottom surface 80 of the barrier member 12. This is the boundary of the space 11 filled with liquid.

There are many other different designs of liquid supply system and a feature of many localized area liquid supply systems is the presence of a meniscus of liquid which extends between the substrate W and a part of the liquid supply system. This meniscus is used in containing the liquid in the space 11 without the use of a mechanical seal. Several features are possible to try and pin the meniscus in place such as the use of gas flows or meniscus pining features on the bottom surface of the substrate 12.

A limiting factor of the speed at which the substrate W can move under the projection system PS is the speed at which the meniscus 510 breaks down due to drag forces on it applied by the moving substrate W. If the meniscus breaks down then liquid can leak from the liquid supply system. Although the design in FIG. 6 can account for this and remove any such liquid using the gas knife 420, this can deleteriously lead to evaporation of the liquid and thereby cooling of the substrate W, which itself can lead to imaging errors.

The present invention is directed to a compatible selection of the material of the substrate W covered in immersion liquid and the immersion liquid itself to increase the strength of the meniscus 510 between the substrate and part of the liquid supply system such that it is possible to move the substrate W under the liquid supply system with increased speed thereby to increase through put without risk of the meniscus 510 breaking down.

It should be appreciated that the invention is equally applicable to other liquid supply systems which do not necessarily have a stationary barrier member 12 as described above. In particular, other measures could be taken to delay meniscus breakdown which are equally compatible with the present invention.

Figure 7:
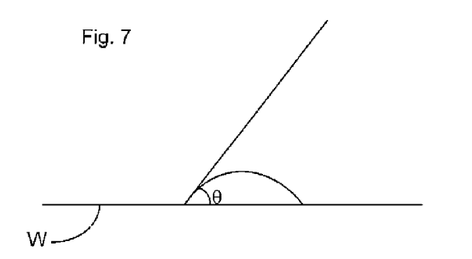
FIG. 7 illustrates a contact angle θ between immersion liquid and a substrate W.

Applicants have found that the static contact angle $\theta$ between the immersion liquid on the top surface of the substrate (which will usually be a top coat or resist) has a large bearing on the stability of the meniscus. The static contact angle $\theta$ is measured as the angle through the liquid between a line which is parallel with the top surface of the substrate and another line which is parallel to the surface of the droplet at the surface of the substrate (as illustrated in FIG. 7). If the contact angle is increased, its stability will increase and thereby allow a faster relative speed between the part of the projection system to which the meniscus is attached and the substrate W without the meniscus breaking down.

It has been found that changing the pH of an immersion liquid can have a large impact on the contact angle between immersion liquid and the top surface of a substrate on which the immersion liquid is resting. These effects can be explained and partly quantified by two models which are described below.

A first model uses the disjoining pressure A to calculate the surface energy of an immersion liquid droplet. The following relationship exists between the static contact angle θ, the disjoining pressure Π(x,pH) and the height x of the liquid droplet. The droplet will form a certain equilibrium film height $x_{equ}$ which is the value of x above which the net disjoining pressure becomes positive.

$$\cos(\theta) = 1 + \int_{x_{equ}}^{\infty} \Pi(x, pH) dx$$

The disjoining pressure contains a polar (Coulomb) $\Pi_E(x, pH)$ and a-polar (Van der Waals) $\Pi_D(x)$ component as follows:

$$\Pi(x,pH)=\Pi_E(x,pH)+\Pi_D(x)$$

Figure 8:
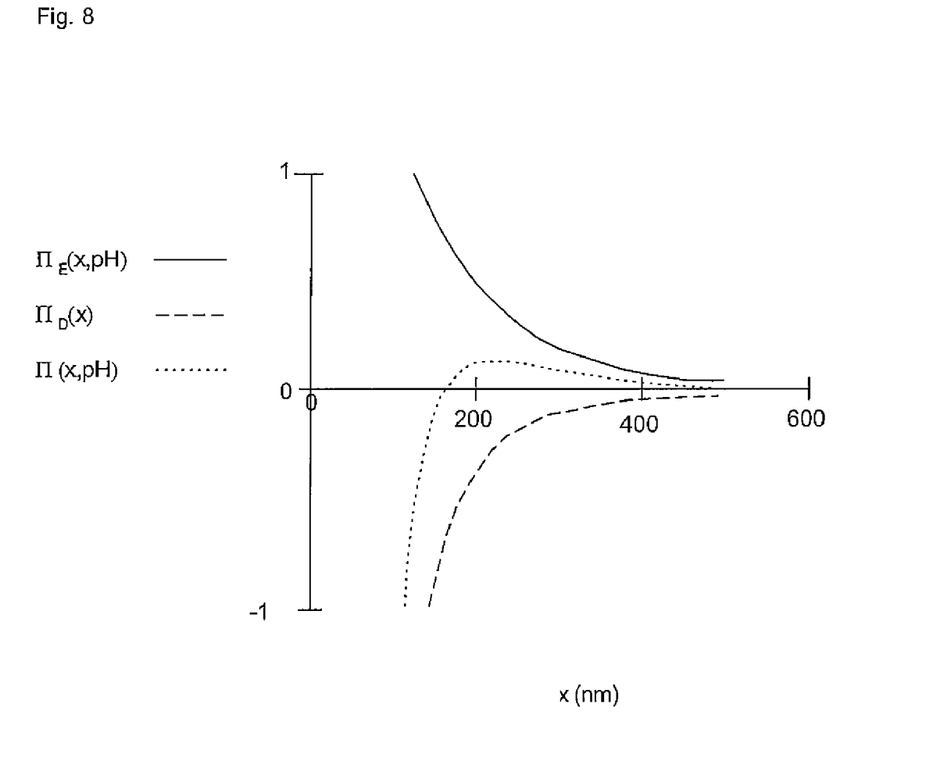
FIG. 8 illustrates schematically how the disjoining pressure contains a polar (Coulomb) and an a-polar (Van der Waals) component.

FIG. 8 illustrates schematically the overall disjoining pressure which is a summation of the polar components and the a-polar component.

The polar component depends strongly on pH, whereas the a-polar component does not. The polar component originates from the electrostatic pull of the charged surface of the substrate on the ions of the immersion liquid. This polar component is influenced by the zeta potential of the immersion liquid when on the surface of the substrate as well as by the absolute value of pH of the immersion liquid.

The polar component of the disjoining pressure scales with the square of zeta potential between the surface of the substrate and the immersion liquid. Thus a reduction from say −40 mV to −10 mV (i.e. by a factor of 4) decreases the polar component of the disjoining pressure by a factor of 16. As a result the disjoining pressure is decreased as well leading to an increase in the contact angle θ.

Figure 9:
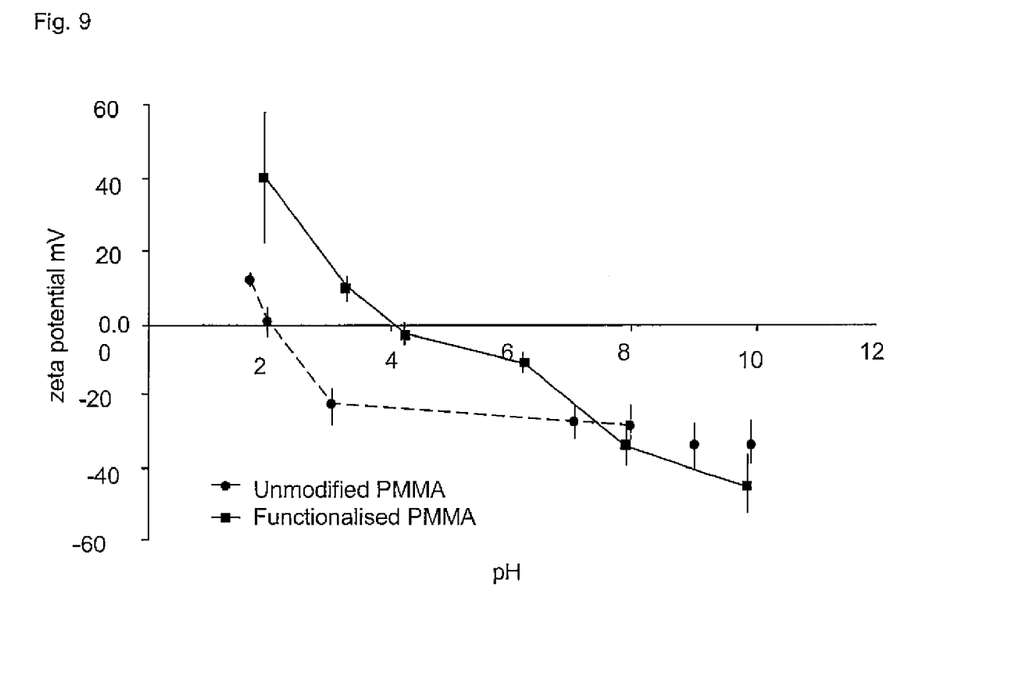
FIG. 9 illustrates schematically the variation of zeta potential between a surface of a substrate and an immersion liquid with changing pH of the immersion liquid.

As can be seen from FIG. 9, which is a graph of pH of immersion liquid along the x axis and zeta potential along the y axis for immersion liquid based on water and for two types of top coat used on the surface of the substrate (unmodified PMMA and functionalized PMMA), it can be seen that zeta potential varies strongly as a function of pH. The closer the pH of the liquid is to the zeta potential zero crossing pH, the smaller the polar component of the disjoining pressure and thus the smaller the polar surface energy and the larger the contact angle θ. In general by using an immersion liquid with a pH within two pH points of the zero crossing zeta potential yields an advantage. This is because of the shape of the curve which generally reaches a maximum and a minimum potential above and below the zero zeta potential crossing pH, at roughly 2 pH points below and above the pH at zero zeta potential. Desirably, the pH of the immersion liquid is within two pH of the pH at which the zeta potential of the immersion liquid on the surface of the substrate is zero, more desirably within 1.5, 1.2, 1.0, 0.8, 0.7, 0.6, 0.5, 0.4, 0.3, 0.2, or 0.1 pH.

The polar component of the disjoining pressure is also influenced by absolute value of pH. The further the pH is from pH 7, the more ions are present in the immersion liquid. This is because the disjoining pressure is directly proportional to the number of ions in the liquid. The number of ions in the liquid is given by $$10^{-pH}+10^{14-pH} \cdot N_A$$

where $N_A$ is the Avogadro constant. This means that the polar component drops off more rapidly (i.e. the curve of the polar component in FIG. 8 moves towards the y axis) meaning that the total area under the disjoining pressure curve decreases thereby leading to a smaller net surface energy and lower contact angle θ.

In summary, a pH as close as possible to the zero zeta potential pH is desired and pH should be chosen so that it is as close as possible to pH7. However, the effect of zeta potential is more marked than the effect of the number of ions present.

Another way of understanding the effect of pH on contact angle is to compare the pH of the immersion liquid with that of the surface of the substrate on which the immersion liquid is supported. This is an understanding based on the second model.

Generally, it has been found, if the surface of the substrate on which the immersion liquid is supported and which is to be imaged (i.e. irradiated) has a pH which is within 2 of the pH of the immersion liquid, that near maximum contact angle for the two specific materials will be present. The pH of the surface can be regarded as the pH of the liquid at the zero zeta potential crossing point. The closer the pH of the surface of the substrate exposed and the immersion liquid the stronger this effect. Desirably the pH of the surface of the substrate to be exposed and the immersion liquid is within 1.5, 1.2, 1.0, 0.8, 0.7, 0.6, 0.5, 0.4, 0.3, 0.2, or 0.1 of each other.

Thus, if the surface of the substrate is a base, then desirably the immersion liquid is also a base and vice versa i.e. if the surface of the substrate is acid, then the immersion liquid should be made acidic. The surface is defined as acid if the zero zeta potential crossing point is below pH 7 and as base if the zero zeta potential crossing point is above pH 7.

The static contact angle θ of a surface with a given liquid can be determined using an energy balance between the Van der Waals (LW), acidic (positive) and basic (negative) components as set out in the Van Oss-Chauduri-Good theory. This theory states that:

$$(1+\cos(\theta)) \cdot \gamma_L = 2(\sqrt{\gamma_{S\_LW} \cdot \gamma_{L\_LW}} + \sqrt{\gamma_{S\_pos} \cdot \gamma_{L\_neg}} + \sqrt{\gamma_{S\_neg} \cdot \gamma_{L\_pos}})$$

where γ is a surface energy, S is for the solid and L is for the liquid.

This equation can be used to derive a relationship between the pH of the liquid and the static contact angle between the liquid and the solid for a given top coat and a given immersion liquid. By choosing the pH of the immersion liquid such that the static contact angle is within 15, 10, 8 or 5 degrees of the maximum, this will result in a more stable meniscus and thereby allow faster relative movement of the substrate W relative to the liquid supply system thereby increasing through put.

As one example, if functional PMMA is used as a top coat, and water is used as immersion liquid, if the water is neutral a static contact angle of about 72 degrees is present. If the pH of the immersion liquid is changed to 5 (e.g. by adding acetic acid, formic acid NaOH, but preferably a gas such as sulphur dioxide, nitrogen dioxide, nitrogen oxide, $N_2O$, $H_2S$, or carbon dioxide etc.), the static contact angle goes up to almost 100 degrees. With these values, a theoretical critical velocity of meniscus collapse goes up from 1 m/s to 1.55 m/s. However, lowering the pH of the water even further has negligible effect because at pH 4 the acidic bond between the top coat and the immersion liquid is already at a maximum.

The maximum velocity achievable can be estimated by the equation:

$$V \approx A \frac{\gamma}{\eta} \theta^{\frac{1}{3}}$$

wherein the constant A is about 250, γ is the surface tension and η the viscosity and the contact angle is in radians. Immersion liquid can be made more basic by adding e.g. ammonia (NH$_3$) or H$_2$O$_2$.

Using the above Van Oss-Chaudhuri-Good equation, it is possible either to select the pH of the immersion liquid or the pH or the top coat or both to optimize the contact angle (taking other considerations to account). This method can work for all polar immersion fluids and polar top surface materials. One example of the method would be to ensure that the pH of the immersion liquid is within 1 of the pH which gives the maximum contact angle using the above equation, desirably within 0.5, 0.4, 0.3, 0.2 or 0.1 of the pH which gives the maximum contact angle.

Thus, if the top coat and immersion liquid are chosen in the above manner, a controller which controls movement of the substrate relative to a part of the liquid supply system to which the meniscus is attached can be controlled to ensure that the relative speed between the substrate W and that part of the liquid supply system is maximized without the meniscus collapsing. For example, the liquid supply system could control such that the speed is at least 1.2 m/s, desirably 1.3, 1.4 or 1.5 m/s or faster, but not so fast that the meniscus collapses.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
an immersion lithography exposure apparatus configured to expose a substrate to a beam of radiation through immersion liquid, wherein a pH of the immersion liquid is selected from within a range of pH values having a central pH value, wherein the central pH value is the pH of the immersion liquid at which its zeta potential when on the surface of the substrate is zero and the range is defined from a pH value equal to two subtracted from the central pH value to a pH value equal to two added to the central pH value, and the pH of the immersion liquid which gives a maximum contact angle of the liquid to the surface of the substrate is within the range.

2. The lithographic apparatus of claim 1, wherein the range is defined from a pH value equal to 1.5 subtracted from the central pH value to a pH value equal to 1.5 added to the central pH value.

3. The lithographic apparatus of claim 1, wherein the range is defined from a pH value equal to 1.2 subtracted from the central pH value to a pH value equal to 1.2 added to the central pH value.

4. The lithographic apparatus of claim 1, wherein the range is defined from a pH value equal to 1.0 subtracted from the central pH value to a pH value equal to 1.0 added to the central pH value.

5. The lithographic apparatus of claim 1, wherein the range is defined from a pH value equal to 0.8 subtracted from the central pH value to a pH value equal to 0.8 added to the central pH value.

6. The lithographic apparatus of claim 1, wherein the range is defined from a pH value equal to 0.5 subtracted from the central pH value to a pH value equal to 0.5 added to the central pH value.

7. The lithographic apparatus of claim 1, wherein the surface of the substrate and the immersion liquid are base.

8. The lithographic apparatus of claim 1, wherein the surface of the substrate has a zero zeta potential of less than pH 7 and the immersion liquid is acid.

9. The lithographic apparatus of claim 1, wherein the immersion liquid has a pH which results in a static contact angle θ of the immersion liquid on the surface, as calculated by the following equation:

$$(1+\cos(\theta))\cdot\gamma_L = 2(\sqrt{\gamma_{S\_LW}\cdot\gamma_{L\_LW}} + \sqrt{\gamma_{S\_pos}\cdot\gamma_{L\_neg}} + \sqrt{\gamma_{S\_neg}\cdot\gamma_{L\_pos}})$$

wherein γ is the surface energy, LW the Van der Waals force, pos the acidic component, neg the basic component, S the substrate and L the immersion liquid, being within 20° of the maximum obtainable by varying the pH.

10. The lithographic apparatus of claim 9, wherein the calculated static contact angle is within 15° of maximum.

11. The lithographic apparatus of claim 9, wherein the calculated static contact angle is within 10° of maximum.

12. The lithographic apparatus of claim 9, wherein the calculated static contact angle is within 8° of maximum.

13. The lithographic apparatus of claim 9, wherein the calculated static contact angle is within 5° of maximum.

14. The lithographic apparatus of claim 9, wherein the calculated static contact angle is a maximum obtainable.

15. The lithographic apparatus of claim 1, wherein the pH of the immersion liquid is within 1.0 of the pH which gives a maximum contact angle using the following equation:

$$(1+\cos(\theta))\cdot\gamma_L = 2(\sqrt{\gamma_{S\_LW}\cdot\gamma_{L\_LW}} + \sqrt{\gamma_{S\_pos}\cdot\gamma_{L\_neg}} + \sqrt{\gamma_{S\_neg}\cdot\gamma_{L\_pos}})$$

wherein γ is the surface energy, LW the Van der Waals force, pos the acidic component, neg the basic component, S the substrate and L the immersion liquid.

16. The lithographic apparatus of claim 15, wherein the pH of the immersion liquid is within 0.5 of the pH which gives the maximum contact angle.

17. The lithographic apparatus of claim 15, wherein the pH of the immersion liquid is within 0.4 of the pH which gives the maximum contact angle.

18. The lithographic apparatus of claim 15, wherein the pH of the immersion liquid is within 0.3 of the pH which gives the maximum contact angle.

19. The lithographic apparatus of claim 15, wherein the pH of the immersion liquid is within 0.2 of the pH which gives the maximum contact angle.

20. The lithographic apparatus of claim 1, wherein the pH of the immersion liquid is closer to pH 7 than the pH at which, the zeta potential is zero.

21. The lithographic apparatus of claim 1, further comprising a controller configured to move the substrate relative to at least part of a liquid supply system with a speed of at least 1.2 m/s.

22. The lithographic apparatus of claim 21, wherein the speed is at least 1.3 m/s.

23. The lithographic apparatus of claim 21, wherein the speed is at least 1.4 m/s.

24. The lithographic apparatus of claim 21, wherein the speed is at least 1.5 m/s.

25. The lithographic apparatus of claim 1, wherein the surface is a top coat.

26. A device manufacturing method comprising projecting a patterned beam of radiation through immersion liquid onto a substrate, wherein the immersion liquid is in contact with a surface of the substrate and a pH of the immersion liquid is selected from within a range of pH values having a central pH value, wherein the central pH value is 2 of the pH of the immersion liquid at which its zeta potential when on the surface of the substrate is zero and the range is defined from a pH value equal to two subtracted from the central pH value to a pH value equal to two added to the central pH value, and the pH of the immersion liquid which gives a maximum contact angle of the liquid to the surface of the substrate is within the range.

27. The method of claim 26, wherein the immersion liquid is provided by a liquid supply system, a meniscus of the liquid extends between the surface of the substrate and a part of the liquid supply system, and the substrate is moved relative to the part at a speed of greater than 1.2 m/s.

28. The method of claim 26, wherein the range is defined from a pH value equal to 1.5 subtracted from the central pH value to a pH value equal to 1.5 added to the central pH value.

29. The method of claim 26, wherein the range is defined from a pH value equal to 1.2 subtracted from the central pH value to a pH value equal to 1.2 added to the central pH value.

30. The method of claim 26, wherein the range is defined from a pH value equal to 1.0 subtracted from the central pH value to a pH value equal to 1.0 added to the central pH value.

31. The method of claim 26, wherein the range is defined from a pH value equal to 0.8 subtracted from the central pH value to a pH value equal to 0.8 added to the central pH value.

* * * * *